(12) United States Patent
Dunsch et al.

(10) Patent No.: US 6,747,544 B2
(45) Date of Patent: Jun. 8, 2004

(54) ELECTRIC SWITCH

(75) Inventors: Martin Dunsch, Hemer (DE); Markus Adam, Olpe (DE)

(73) Assignee: Leopold Kostal GmbH & Co. KG, Ludenscheid (DE)

( * ) Notice: Subject to any disclaimer, the term of this patent is extended or adjusted under 35 U.S.C. 154(b) by 18 days.

(21) Appl. No.: 10/431,801

(22) Filed: May 8, 2003

(65) Prior Publication Data

US 2003/0227404 A1 Dec. 11, 2003

Related U.S. Application Data

(63) Continuation of application No. PCT/EP02/01716, filed on Feb. 19, 2002.

(30) Foreign Application Priority Data

Feb. 22, 2001 (DE) .......................... 101 08 605

(51) Int. Cl.[7] .............................................. H01C 10/48
(52) U.S. Cl. ..................... 338/191; 338/194; 338/118; 341/154
(58) Field of Search .............................. 200/1 R, 11 D, 200/11 DA, 16 R, 16 A, 18, 11 TC; 338/118, 128, 160, 162, 123, 201, 320, 179, 185, 191, 194, 196; 341/153, 154

(56) References Cited

U.S. PATENT DOCUMENTS

| 4,012,710 | A | * | 3/1977 | Ward et al. ............... 338/128 |
| 4,314,666 | A | * | 2/1982 | Schotten ................... 338/201 |
| 4,500,866 | A | * | 2/1985 | Romann et al. ........... 338/126 |
| 4,788,393 | A | * | 11/1988 | Muramatsu et al. .... 200/11 DA |
| 4,970,512 | A | | 11/1990 | Wood |
| 5,010,445 | A | * | 4/1991 | Weinold ................... 361/728 |
| 5,495,245 | A | * | 2/1996 | Ashe ......................... 341/153 |
| 6,181,265 | B1 | * | 1/2001 | Lee ........................... 341/154 |
| 6,292,090 | B1 | * | 9/2001 | Higuchi .................... 338/118 |
| 6,384,762 | B2 | * | 5/2002 | Brunolli et al. ........... 341/154 |

FOREIGN PATENT DOCUMENTS

| DE | 37 13319 A1 | 4/1987 |
| DE | 198 30 581 A1 | 7/1998 |
| DE | 199 06 035 A1 | 2/1999 |

* cited by examiner

*Primary Examiner*—Lincoln Donovan
*Assistant Examiner*—M. Fishman
(74) *Attorney, Agent, or Firm*—Brooks Kushman P.C.

(57) ABSTRACT

An electric switch (1) having digital switch position detection includes a switching device (2) for contacting switch contacts associated with individual code tracks (A, B, C), different switch contacts being contacted by the switching device in different switch positions in totality and the tap off of the switch contacts contacted by the switching device (2) being applied to an evaluation unit (9). Depending on the position of the switching device (2) in at least some switch positions the voltage level has a different value to additionally distinguish this switch position.

9 Claims, 2 Drawing Sheets

ELECTRIC SWITCH

CROSS-REFERENCE TO RELATED APPLICATIONS

This is a continuation of International Application PCT/EP02/01716, published in German, with an international filing date of Feb. 19, 2002.

BACKGROUND OF THE INVENTION

1. Field of the Invention

The present invention relates to an electric switch having digital switch position detection including a switching device for contacting switch contacts associated with individual code tracks, different switch contacts being contacted by means of the switching device in different switch positions in totality and the tap off of the switch contacts contacted by the switching device being applied to an evaluation unit.

2. Background Art

Electric switches are known which can be brought into different switch positions. In the automotive industry, such switches can be associated with, e.g., a gearshift lever or also a cruise control device. These switches include as a switching device mostly a slider which extends over multiple code tracks. The code tracks bear individual switch contacts, it being provided that in different positions of the switching device and thus in different switch positions in totality, different switch contacts of the individual code tracks are contacted by the switching device.

The individual switch positions are distinguishable from one another in that a switch contact is contacted or not contacted depending on the position of the switching device. Such a switch contact is evaluated accordingly as a digital "0" or a digital "1". Through appropriate combination of the contacting of the switch contacts in individual code tracks, the individual switch positions of the electric switch are distinguishable from one another in that each combination of contacted and non-contacted switch contacts is defined only once in the different switch positions.

The individual switch contacts are connected via in each case a tap line to an evaluation unit which is responsible for the read-out and evaluation of the switch contacts depending on the switch positions. Depending on the recognized switch position, a corresponding signal is then generated by the processor unit to trigger one or more actuators.

Even if an electrical switch of this sort basically functions in a satisfactory manner and can be manufactured with simple means, problems can arise in terms of unambiguous switch position detection if the contacting between a switch contact and the switching device takes place only in an insufficient manner, e.g., if the contact point is soiled. In such a case, it is possible that, due to the poor contacting, the contact resistance will be so large that the voltage level detected on the evaluation end lies below the specified threshold and incorrect switch position detection thus occurs as a result, even though it is not possible to detect that the read-out result is faulty. This is correspondingly true also in case of a line interruption.

SUMMARY OF THE INVENTION

Accordingly, there exists a desire to have an electric switch which enables reliable switch position detection, particularly also in terms of error detection.

Therefore, the object of the present invention is to further develop an electric switch as described in the introduction such that reliable switch position detection including error detection is possible.

This objective is solved according to the present invention in that depending on the position of the switching device in at least some switch positions the voltage level exhibits a different value to additionally distinguish this switch position.

In the electric switch according to the present invention, it is provided that the voltage level is not constant in different switch positions, but is used as an additional distinguishing criterion for the different switch positions. The benefit of this type of additional switch position encoding is that basically each switch position is first encoded digitally. Due to the additional and basically redundant information, it is possible to evaluate a switch position for the presence of an error because the voltage level of the contacted switch contacts in a switch position is evaluated in analog terms and it is different in each switch position. An electric switch is thus created in an easy manner for which the switch positions can be evaluated redundantly using digital and analog encoding. Error detection is made possible by the implemented analog evaluation.

In an electric switch of this sort, it can be provided that by means of the different voltage levels the digital "0" is divided into individual voltage levels, advantageously voltage level intervals corresponding to the number of switch positions to be implemented. Then, the digital "1" can be constant in terms of its voltage level. Analogously, an electric switch of this sort can also be structured inversely or using some combination.

To provide different voltage levels in the different switch positions, it is provided in a first embodiment of the present invention that, in the level track, in each case a differently encoded pull-down resistor is connected. In a second embodiment, it is provided to implement the level track line as a continuous potentiometer track which is connected with its one end to the operating voltage potential Vcc and with its other end to ground potential GND. Voltage level provision of this sort can be implemented in a particularly simple manner. The taps off of the individual switch contacts are applied to an A/D converter which is connected on the input side to a processor unit. Associated with the processor unit is a memory module in which the voltage levels or rather the voltage level intervals designating the different switch positions are stored.

BRIEF DESCRIPTION OF THE DRAWINGS

The present invention is described hereafter based on an exemplary embodiment with reference to the attached figures. The figures show the following.

DETAILED DESCRIPTION OF THE PREFERRED EMBODIMENT(S)

Figure 1:
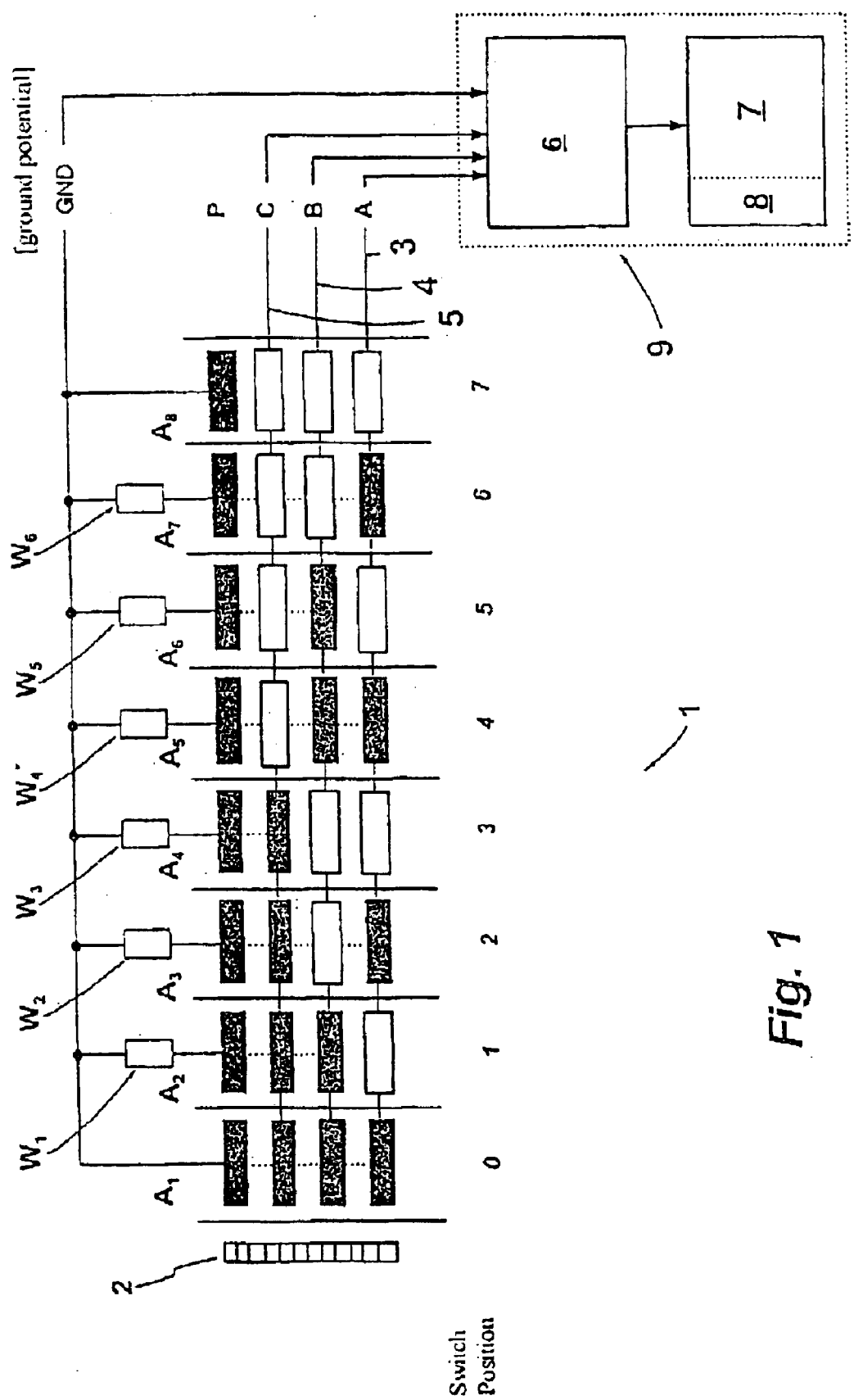
FIG. 1 illustrates in a block diagram the different switch positions of an electric switch according to a first embodiment of the present invention.

As can be seen in FIG. 1, an electric switch 1 in accordance with the present invention includes as the switching device a slider 2. Slider 2 lies with its contacts on three digital code tracks A, B, C having electric switch contacts and is movable with respect to them. Switch 1 as shown can theoretically be brought into eight different switch positions.

The switch contacts which are contacted by slider 2 in individual switch positions are represented in the FIG. 1 with black boxes. A switch contact which is not contacted by slider 2 is shown as an unfilled box.

Slider 2 contacts the level track P in every switch position. The digital encoding of electric switch 1 is designed so that the filled boxes represent a digital "0" and the unfilled boxes a digital "1". Thus, for electric switch 1 shown here, the digital "1" is constant and the digital "0" is to be seen as an additional analog encoded variable. In fact, only the switch positions 1 through 6 are used in electric switch 1; detection of, for example, the unused switch position 7 as a read-out result from one of the switch positions 1 through 6 indicates, for instance, a line interruption.

Based on the switch position 0 in which slider 2 contacts the switch contacts of all three code tracks A, B, C and they are thus to be read out altogether as a digital "0" so that no voltage level can be detected, there occurs in the further switch positions in each case a different contacting of, in totality, different switch contacts of the digital code tracks A, B, C.

In the switch position 7, no switch contacts of code tracks A, B, C are contacted so that in this position all of the code tracks A, B, C are recognized as a digital "1". In each switch position, slider 2 is connected with respect to its level track P to a different level track branch A1–A8. The switch contacts of code tracks A, B, C are connected in each case via a tap line 3, 4, 5 to an A/D converter 6 which also has an electrical ground (GND) line applied to it to which the level track branches A1–A8 are connected. In each case a different pull-down resistor W1–W6 is connected in the level track branches A1–A6 so that the voltage level read out in each case on the tap lines 3, 4, 5 is different depending on the encoding of the resistor W1–W6 of a switch position. The necessary pull-up resistors are associated with the subsequent evaluation unit.

Figure 2:
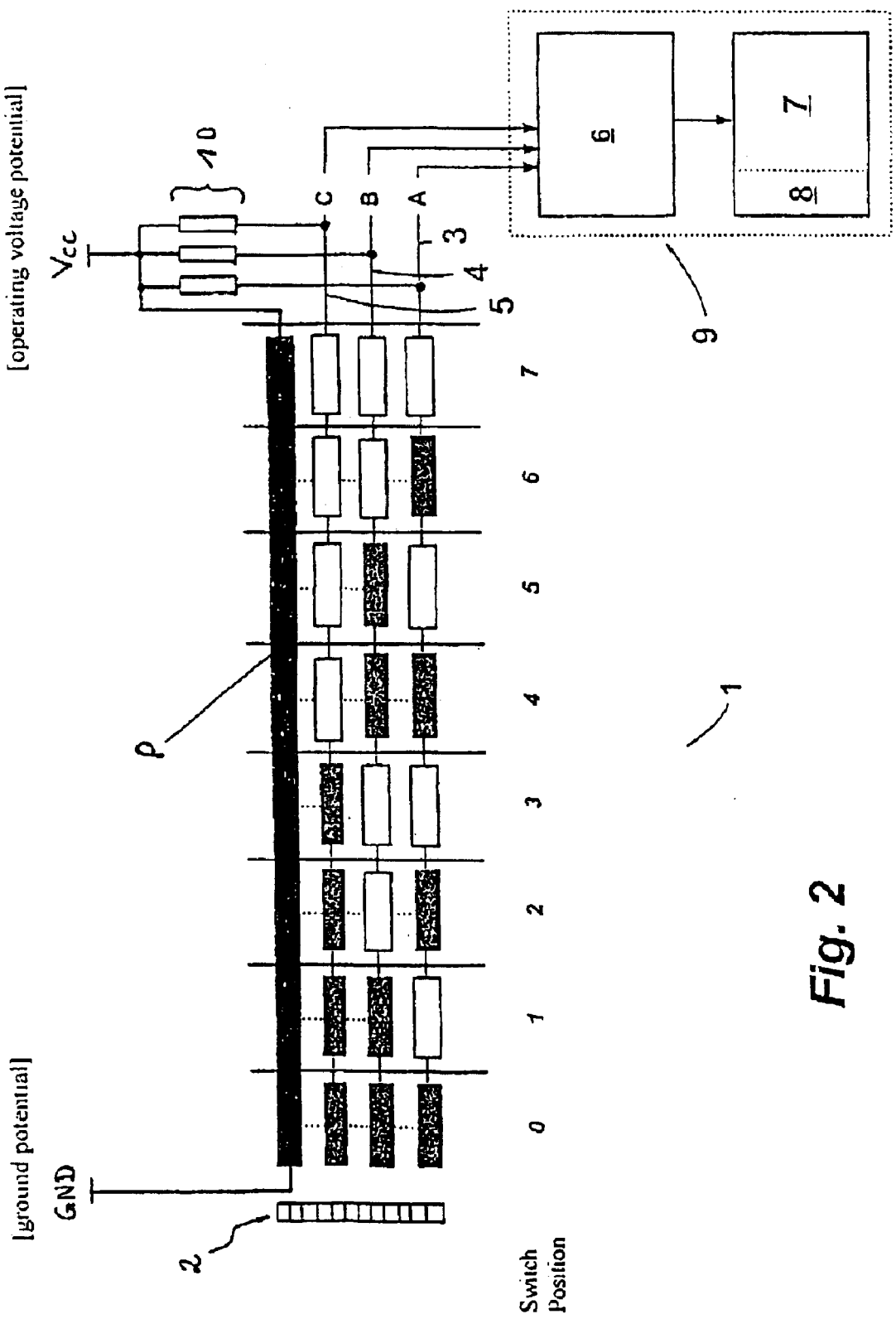
FIG. 2 illustrates a second embodiment of the electric switch according to the present invention with a potentiometer track as the level track.

Likewise in the embodiment shown in FIG. 2, electric switch 1 includes as the switching device a slider 2 which lies with its contacts on three digital code tracks A, B, C having electric switch contacts as well as on a level track P and can be brought into different switch positions. As in FIG. 1, the contacted and non-contacted switch contacts are represented by filled and unfilled boxes and the digital encoding of electric switch 1 is designed here too so that the filled boxes represent a digital "0" and the unfilled boxes a digital "1".

The main difference compared to the embodiment in FIG. 1 is that in the embodiment shown in FIG. 2 a continuous potentiometer track is used as the level track P. The potentiometer track is connected with its one end, which is close to switch position 0, to ground potential GND and with its other end, which is close to switch position 7, to the operating voltage potential Vcc. In each intermediate position, a potential is provided by the potentiometer track and transmitted by slider 2 to the switch contacts contacted in each case of the code tracks A, B, C which potential lies between these two values (here, e.g., 0 and 5 Volts), and whose value in each case is obtained from the distance of the tap point from the ends of the potentiometer track.

The voltage value associated with a switch position is thus dependent on where slider 2 lies on the switch contact, which, however, can be detected through the level value specified in any case as an interval with no further requirements. By means of pull-up resistors 10 in tap lines 3, 4, and 5 of the code tracks A, B, C, it is ensured that non-contacted code tracks exhibit in each case a voltage level greater than (>) 4.75 Volts. The benefit associated with this embodiment relates particularly to the saving of pull-down resistors and to the independence from the contact resistance of the slider.

The table provided hereafter shows value ranges of the read-out voltage level for defining a switch position at an operating voltage of 5 Volts:

| Switch position | Contact A (digital) | Contact B (digital) | Contact C (digital) | Level range [V] |
|---|---|---|---|---|
| 0 | 0 | 0 | 0 | <0.50 |
| 1 | 1 | 0 | 0 | 0.50–1.00 |
| 2 | 0 | 1 | 0 | 1.25–1.75 |
| 3 | 1 | 1 | 0 | 2.00–2.50 |
| 4 | 0 | 0 | 1 | 2.75–3.25 |
| 5 | 1 | 0 | 1 | 3.50–4.00 |
| 6 | 0 | 1 | 1 | 4.25–4.75 |
| 7 | 1 | 1 | 1 | >4.75 |

An A/D converter 6 is connected on the input side to a processor unit 7 with which is associated a memory module 8 in which the level intervals for designating the different switch positions are stored. Thus, when evaluating the switch position, it is possible, besides using the digital code, to check the digital switch position detection result using the detected voltage level. The evaluation unit is designated overall in FIG. 2 with reference number 9.

Based on the description of the present invention, it is clear that with the described electric switch, switch position detection can take place using simple means in a redundant manner and that in particular an erroneous interpretation of a switch position is avoided in this manner.

Reference list:
1 Electric switch
2 Slider
3 Tap line
4 Tap line
5 Tap line
6 A/D converter
7 Processor unit
8 Memory module
9 Evaluation unit
10 Pull-up resistors
A1–A8 Level track branch
A, B, C Digital code tracks
P Level track
W1–W6 Pull-down resistor While embodiments of the present invention have been illustrated and described, it is not intended that these embodiments illustrate and describe all possible forms of the present invention. Rather, the words used in the specification are words of description rather than limitation, and it is understood that various changes may be made without departing from the spirit and scope of the present invention.

What is claimed is:

1. An electric switch having digital switch position detection and redundant analog switch position detection, the switch comprising:

individual digital code tracks, each digital code track having switch contacts, each switch contact of a digital code track being associated with a respective switch position;

a slider movable with respect to the digital code tracks to move between the switch positions, wherein in each switch position the slider contacts a different set of the switch contacts of the digital code tracks such that each contacted switch contact set is digitally representative of a respective switch position;

an evaluation unit connected to the switch contacts of the digital code tracks by respective tap lines for receiving a digital signal indicative of the contacted switch contact set, the evaluation unit determining the digital representation of the switch position based on the digital signal; and a level track having track contacts, each track contact being associated with a respective switch position, each track contact being connected to the evaluation unit by a different electrical resistance;

wherein in each switch position the slider contacts a respective track contact such that an analog signal having a voltage dependent upon the electrical resistance connecting the contacted track contact to the evaluation unit is received by the evaluation unit, the voltage of the analog signal being indicative of the switch position associated with the contacted track contact, the evaluation unit determining an analog representation of the switch position based on the analog signal.

2. The switch of claim 1 wherein:

differently encoded pull-down resistors connect respective track contacts to the evaluation unit in order for the track contacts to be connected to the evaluation unit by different electrical resistances.

3. The switch of claim 2 wherein:

the evaluation unit includes pull-up resistors associated with the pull-down resistors.

4. The switch of claim 1 wherein:

the level track is a continuous potentiometer electrical resistor track connected at one end to electrical ground and connected at the other end to an operating voltage potential.

5. The switch of claim 1 wherein:

the evaluation unit includes an A/D converter and a processor unit, wherein the tap lines connecting the A/D converter of the evaluation unit to the switch contacts of the digital code tracks, the A/D converter converting the digital signal into a corresponding analog signal, the processor unit processing the corresponding analog signal to determine the digital representation of the switch position.

6. The switch of claim 1 wherein:

the evaluation unit includes a memory module, wherein the memory module stores voltage ranges, each voltage range being associated with a switch position, wherein the evaluation unit determines the analog representation of the switch position based on the stored voltage range of which the voltage of the analog signal falls within.

7. The switch of claim 1 wherein:

the switch has n switch positions, wherein the voltage of the analog signal in n−1 switch positions are characterized by in each case different voltage levels which in each case are less than a maximum voltage level.

8. The switch of claim 1 wherein:

the digital signal "0" is encoded additionally in an analog manner by different voltage levels in different switch positions.

9. The switch of claim 1 wherein:

the digital signal "1" is encoded additionally in an analog manner by different voltage levels in different switch positions.

* * * * *